United States Patent
Oh et al.

(10) Patent No.: US 9,559,210 B2
(45) Date of Patent: Jan. 31, 2017

(54) THIN FILM TRANSISTOR AND METHOD OF MANUFACTURING THE SAME

(71) Applicant: Samsung Display Co. Ltd., Yongin, Gyeonggi-Do (KR)

(72) Inventors: Dong Gun Oh, Osan-si (KR); Young Gu Kang, Hwaseong-si (KR); Sung In Ro, Hwaseong-si (KR); Jae Hak Lee, Suwon-si (KR); Sung Hoon Lim, Suwon-si (KR); Woong Ki Jeon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/800,187

(22) Filed: Jul. 15, 2015

(65) Prior Publication Data
US 2016/0197196 A1    Jul. 7, 2016

(30) Foreign Application Priority Data
Jan. 7, 2015    (KR) .......................... 10-2015-0002104

(51) Int. Cl.
| H01L 29/786 | (2006.01) |
| H01L 29/66 | (2006.01) |
| H01L 27/12 | (2006.01) |

(52) U.S. Cl.
CPC ..... *H01L 29/78648* (2013.01); *H01L 27/1214* (2013.01); *H01L 29/66742* (2013.01)

(58) Field of Classification Search
CPC .................... H01L 29/78666; H01L 29/78669; H01L 29/78675; H01L 29/78678
See application file for complete search history.

(56) References Cited

U.S. PATENT DOCUMENTS

| 8,421,078 B2 | 4/2013 | Chang et al. |
| 9,379,249 B2 * | 6/2016 | Ji ...................... H01L 29/66969 |

FOREIGN PATENT DOCUMENTS

| KR | 1019950003898 | 2/1995 |
| KR | 1020130061070 | 6/2013 |
| KR | 1020140022523 | 2/2014 |
| KR | 1020140050001 | 4/2014 |

* cited by examiner

*Primary Examiner* — Cuong Q Nguyen
(74) *Attorney, Agent, or Firm* — F. Chau & Associates, LLC

(57) ABSTRACT

A thin film transistor is provided as follows. A first gate electrode and a second gate electrode are stacked on each other. A semiconductor layer is interposed between the first and second gate electrodes. A source electrode and a drain electrode are interposed between the semiconductor layer and the second gate electrode. A connection electrode connects electrically the first gate electrode and the second gate electrode. A first insulating film is interposed between the first gate electrode and the semiconductor layer. A second insulating film includes a first part interposed between the semiconductor layer and the second gate electrode and a second part interposed between the second gate electrode and the drain electrode. A third insulating film includes a first part interposed between the connection electrode and the second gate electrode.

9 Claims, 10 Drawing Sheets

THIN FILM TRANSISTOR AND METHOD OF MANUFACTURING THE SAME

CROSS-REFERENCE TO RELATED APPLICATION

This application claims priority under 35 U.S.C. §119 to Korean Patent Application No. 10-2015-0002104, filed on Jan. 7, 2015 in the Korean Intellectual Property Office, the disclosure of which is incorporated by reference herein in its entirety.

TECHNICAL FIELD

The present invention relates to a thin film transistor and a method of manufacturing the same.

DISCUSSION OF THE RELATED ART

Thin film transistors (TFT) are used as switching elements for controlling the operation of each pixel or a driving element for driving each pixel in a display device, such as a liquid crystal display device (LCD) or an organic light emitting device (OLED).

Mobile products such smartphones or tablets demand smaller semiconductor chips implemented using smaller thin film transistors.

SUMMARY

According to an exemplary embodiment of the present invention, a thin film transistor is provided as follows. A first gate electrode and a second gate electrode are stacked on each other. A semiconductor layer is interposed between the first and second gate electrodes. A source electrode and a drain electrode are interposed between the semiconductor layer and the second gate electrode. A connection electrode connects electrically the first gate electrode and the second gate electrode. A first insulating film is interposed between the first gate electrode and the semiconductor layer. A second insulating film includes a first part interposed between the semiconductor layer and the second gate electrode and a second part interposed between the second gate electrode and the drain electrode. A third insulating film includes a first part interposed between the connection electrode and the second gate electrode.

According to an exemplary embodiment of the present invention, a method of manufacturing a thin film transistor is provided. A first gate electrode is formed on a substrate. A first insulating film is formed on the substrate on which the first gate electrode is formed. A first hole is formed in the first insulating layer, exposing a part of the first gate electrode. A semiconductor layer is formed on the first insulating film having the first hole. A source electrode and a drain electrode are formed on the semiconductor layer. A second insulating film is formed on the substrate on which the source electrode and the drain electrode are formed, filling the first hole and covering the part of the first gate electrode. A second gate electrode is formed on the first gate electrode to be interposed between the first gate electrode and the second gate electrode. A third insulating film is formed on the substrate on which the source electrode, the drain electrode and the second gate electrode are formed. A first contact hole is formed by etching the second insulating film and the third insulating film to expose the part of the first gate electrode and a part of the second gate electrode. A connection electrode is formed in the first contact hole to connect electrically the part of the first gate electrode and the part of the second gate electrode which are exposed by the first contact hole.

According to an exemplary embodiment of the present invention, a method of manufacturing a thin film transistor is provided as follows. A first gate electrode is formed on a substrate. A first insulating film is formed on the substrate on which the first gate electrode is formed. A semiconductor material layer and a metal layer are laminated on the first insulating film. The semiconductor material and the metal layer are patterned in the same process to form a semiconductor layer, a source electrode and a drain electrode. A first hole is formed in the first insulating film exposed by the patterning of the semiconductor material and the metal layer. The first hole exposes a part of the first gate electrode. A second insulating film is formed on the substrate on which the source electrode and the drain electrode are formed, filling the first hole and covering the part of the first gate electrode. A second gate electrode is formed on the first gate electrode. The second insulating film is interposed between the first gate electrode and the second gate electrode. A third insulating film is formed on the substrate on which the second gate electrode is formed. A contact hole is formed by etching the second and third insulating films to expose the part of the first gate electrode covered by the second insulating film and a part of the second gate electrode. A connection electrode is formed in the first contact hole to connect electrically the part of the first gate electrode and the part of the second gate electrode which are exposed by the contact hole.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
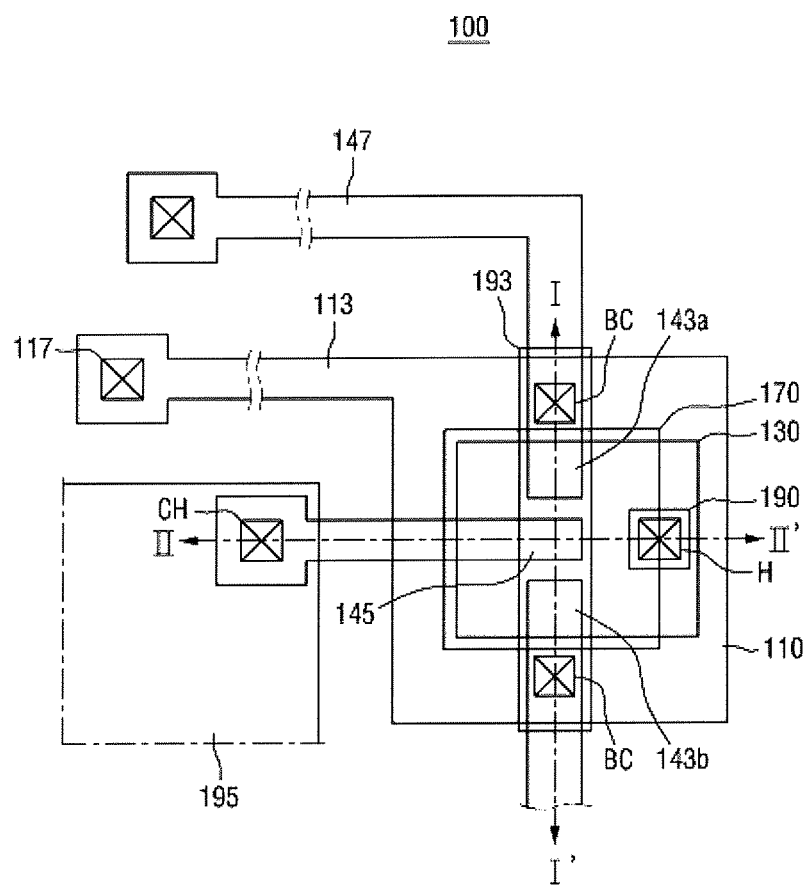
FIG. 1 is a layout of a thin film transistor according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings. Hereinafter, a "hole" may be interchangeably used with a "contact hole".

Figure 2:
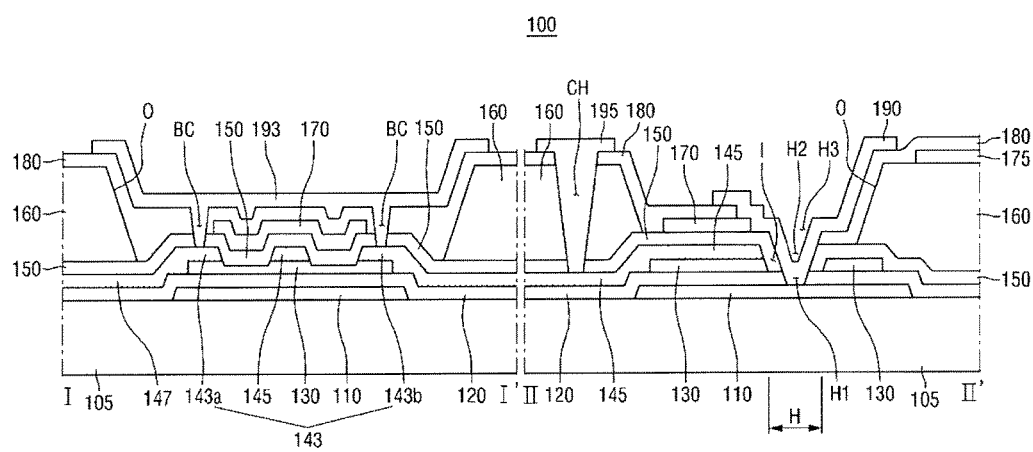
FIG. 2 is a cross-sectional view taken along line I-I' and line II-II" of FIG. 1.
Figure 3:
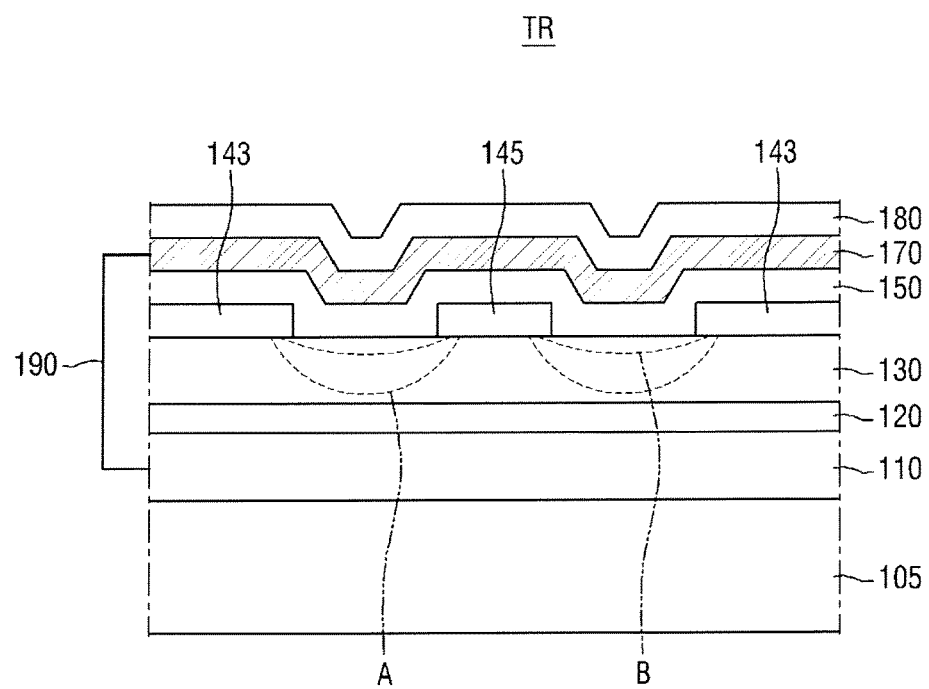
FIG. 3 is a cross-sectional view illustrating a channel formation of the thin film transistor of FIG. 1 according to an exemplary embodiment of the present invention.

FIG. 1 is a layout of a thin film transistor according to an exemplary embodiment of the present invention, FIG. 2 is a cross-sectional view taken along line I-I' and the line II-II" of FIG. 1, and FIG. 3 shows a channel formation of the thin film transistor of FIGS. 1 and 2, according to an exemplary embodiment of the present invention.

For the convenience of description, different sections of the same region in which a thin film transistor is formed are illustrated, and the description will be provided by being divided into a region in which a bridge electrode is formed, and a region in which a first gate electrode and a second gate electrode are in contact with each other.

Referring to FIGS. 1 to 3, a thin film transistor TR performs the functions as a switching element for controlling the operation of each pixel or a drive element for driving each pixel.

The thin film transistor includes a first gate electrode 110 disposed on a substrate 105. A first insulating film 120 is disposed over the whole surface of the substrate including the first gate electrode 110 and has a first hole H1 for exposing a part of the first gate electrode 110. A semiconductor layer 130 is disposed on the first insulating film 120 and is disposed to overlap the first gate electrode 110. A source electrode 143 and a drain electrode 145 are spaced apart from each other, and the source electrode 143 at least partially overlaps the semiconductor layer 130. A second insulating film 150 is a protective film disposed on the whole surface of the substrate on which the source electrode 143 and the drain electrode 145 are formed. The second insulating film 150 includes a second hole H2 which is concentric with the first hole H1. The first and second holes H1 and H2 are connected to each other. A second gate electrode 170 is disposed on the second insulating film 150, overlapping the first gate electrode 110. A third insulating film 180 is a protective film disposed on the second gate electrode 170, having a third hole H3 which is concentric with the second hole H2. The second and third holes H2 and H3 are connected to each other. The third hole H3 is greater than the second hole H2 to expose a part of the second gate electrode 170. A connection electrode 190 is disposed within a contact region H including the first hole H1, the second hole H2 and the third hole H3, connecting the first gate electrode 110 and the second gate electrode 170.

The thin film transistor TR includes a substrate 105, a first gate electrode 110 disposed on the substrate 105, a first insulating film 120 disposed over the whole surface of the substrate formed with the first gate electrode 110, a semiconductor layer 130 disposed on the first insulating film 120, a source electrode 143 and a drain electrode 145 disposed so as to partially overlap the semiconductor layer 130, a second insulating film 150 and a third insulating film 180 disposed over the whole surface of the substrate formed with the source electrode 143 and the drain electrode 145, and a bridge electrode 193 which connects between the source electrodes 143 spaced apart from each other through a bridge hole BC formed through the second and third insulating films 150, 180.

Also, the thin film transistor TR includes a first gate electrode 110 disposed on the substrate 105, a first insulating film 120 which is disposed over the whole surface of the substrate formed with the first gate electrode 110 and has a first hole H1 for exposing a part of the first gate electrode 110, a semiconductor layer 130 disposed on the first insulating film 120, a drain electrode 145 disposed so as to partially overlap the semiconductor layer 130, a second insulating film 150 disposed on the drain electrode 145, a second gate electrode 170 disposed on the second insulating film 150, a second insulating film 180 disposed on the second gate electrode 170, a second hole H2 and a third hole H3 which are each formed by etching the second and third insulating films 150, 180, and a connection electrode 190 disposed in the first, second and third holes H1, H2, H3.

First, the first gate electrode 110 disposed on the substrate 105 is connected to the gate line 113 in a region in which the thin film transistor TR is disposed, and may have a projecting shape, a plate shape or the like. Although it is schematically illustrated in FIG. 1, a gate pad region 117 is disposed at a distal end of the gate line 113 to receive a gate signal and transmit the signal to the first gate electrode 110.

The first insulating film 120 formed of silicon oxide or silicon nitride is disposed on the whole surface of the substrate 105 including the first gate electrode 110. Here, the first hole H1 for exposing a part of the first gate electrode 110 by etching the first insulating film 120 is disposed in the contact region H of the first gate electrode 110.

The semiconductor layer 130 is disposed on the first insulating film 120. The semiconductor layer 130 may be formed of hydrogenated amorphous silicon, polycrystalline silicon or oxide-based semiconductor oxide including zinc oxide (ZnO) or the like. The above-described semiconductor layer 130 may be disposed in a region including the first and second source electrodes 143a, 143b and the drain electrode 145.

The semiconductor layer 130 may be disposed on the contact region H. The contact region H penetrate the semiconductor layer 130 without contacting the semiconductor layer 130.

The first gate electrode 110 is exposed in the contact region by the holes H1 to H3.

In the contact region H, a part of the first insulating film 120 is further extended than the semiconductor layer 130 toward the inside of the contact region H, and thus the part of the first insulating film 120 is exposed by the second hole H2. For example, the upper surface of the first insulating film 120 is partially exposed by the partial removal of the semiconductor layer 130, which may be referred to as a second gate insulating region I.

The second insulating film 150 covers a the exposed upper surface of the first insulating film 120, a side of the semiconductor layer 130, the side and top of the source electrode 143 and the drain electrode 145.

When the semiconductor layer 130 is disposed to cover the contact region H, the partially floating patterns of the semiconductor layer 130 as viewed in the cross-section may remain in the semiconductor layer 130 according to the shape of the pattern of the semiconductor layer 130, while forming the hole that passes through the semiconductor layer 130. Although the above-described floating patterns need not exist according to the designed shape of the semiconductor layer 130 in some cases, in the drawing, the floating patterns of the semiconductor layer 130 are illustrated in the state of being left.

Although not illustrated in the drawings, an ohmic contact layer made of a material such as n+ hydrogenated amorphous silicon doped with n-type impurity at a high concentration may be interposed between the semiconductor layer 130 and the electrodes 143 and 145.

The drain electrode 145 is positioned underneath the semiconductor layer 130. The pixel electrode 195 is disposed in the contact hole CH to be connected to the drain electrode 145 exposed by the contact hole CH.

Moreover, on the substrate 105 formed with the semiconductor layer 130, a data line 147, a first source electrode 143a branching from the data line 147 and a second source electrode 143b spaced apart from the first source electrode 143a at a predetermined interval are disposed. The drain electrode 145 is disposed between the first source electrode 143a and the second source electrode 143b. Hereinafter, when referring to the first source electrode 143a and the second source electrode 143b together, they will be referred to as a source electrode 143.

The first and second source electrodes 143a, 143b and the drain electrode 145 may be disposed on the ohmic contact layer.

Here, the thin film transistor TR is an element having at least three terminals which include the gate electrode 115, the drain electrode 145 and the source electrode 143. The thin film transistor TR has a channel region formed in the semiconductor layer 130 between the drain electrode 145 and the source electrode 143, and current flow through the drain electrode 145, the channel region and the source electrode 143 of the transistor TR.

In an exemplary embodiment, the element indicated by reference numeral 143 may be referred to as a source electrode, and the element indicated by reference numeral 145 may be referred to as a drain electrode 145, depending on operating conditions.

As described above, the second insulating film 150, the organic film 160 and the third insulating film 180 are sequentially disposed on the substrate 105 on which the source electrode 143 and the drain electrode 145 are disposed.

The second insulating film 150 may be formed of an inorganic material including silicon nitride (SiNx) or silicon oxide (SiOx). The second insulating film 150 is disposed on the second gate insulating region I. For example, the exposed upper surface of the first insulating film 120 is in contact with the second insulating film 150. The side surface of the semiconductor layer 130 is in contact with the second insulating film 150. Thus, the second insulating film 150 may serve to insulate the semiconductor layer 130 and the connection electrode 190 from each other and may also insulate the second gate electrode 170, the source electrode 143 and the drain electrode 145 from one another.

The second hole H2 is formed in the second insulating film 150, and the second hole H2 is concentric with the first hole H1. The second insulating film 150 is disposed on the side of the connection electrode 190 disposed in the second hole H2 and the semiconductor layer 130. The first and second insulating films 120 and 150 serve to protect an underlying layer from subsequent processes.

Therefore, the connection electrode 190 connecting the first gate electrode 110 and the second gate electrode 170 may form a channel in the semiconductor layer 130 using the second insulating film 150 as a gate oxide. A channel is formed in the semiconductor layer 130 by the first gate electrode 110 and the first insulating film 120 in the right-side cross section of FIG. 2, and a channel is formed in the semiconductor layer 130 by the second gate electrode 170 and the second insulating film 150 in the left-side cross section of FIG. 2.

The organic film 160 is disposed on the second insulating film 150. The organic film 160 include an opening O in which the first gate electrode 110 is formed. Moreover, a common electrode 175 is disposed on an upper surface of the organic film 160. Accordingly, the common electrode 175 is positioned higher than the first gate electrode 110.

The organic film 160 may be formed of at two film layers. For example, an lower inorganic film and an upper organic film to protect the portion of the exposed semiconductor layer 130 and securing planarization characteristics of the organic film 160. Thus, the aperture ratio of a display device including a thin film transistor according to the present embodiment may improve.

The third insulating film 180 is disposed on the second insulating film 150. The second gate electrode 170 is interposed between the second insulating film 150 and the third insulating film 180. The second gate electrode 170 overlaps the first gate electrode 110 in the opening O.

The second gate electrode 170 is disposed on the semiconductor layer 130, overlapping a part of the source electrode 143 and overlapping the drain electrode 145. The second gate electrode 170 and the common electrode 175 may be formed of the same material, and may be formed using a single mask. The second gate electrode 170 is disposed, in the opening O, on the second insulating film 150, and the common electrode 175 is positioned, outside the opening, on the upper surface of the organic film 160.

Here, the third hole H3 of the third insulating film 180 is concentric with the first hole H1 and the second hole H2.

Thus, in the contact region H, the first hole H1 is formed in the first insulating film 120, the second hole H2 is formed in the second insulating film 150, and the third hole H3 is formed in the third insulating film 180. The above-mentioned contact region H is able to expose a part of the first gate electrode 110.

Here, the second contact hole H2 exposes the second gate insulating region I. The second insulating film 150 is disposed on the first insulating film 120 exposed by the second hole H2. For example, the second insulating film 150 is formed in the second gate insulating region I to insulate the connection electrode 190, the semiconductor layer 130 and the drain electrode 145 from one another.

The third hole H3 is greater than the second hole H2 to the extent that the third hole H3 exposes partially the second gate electrode 170. The connection electrode 190 is disposed in the contact region H so that the connection electrode 190 connects the second gate electrode 170 and the first gate electrode 110. For example, the second gate electrode 170 is connected to the first gate electrode 110 using the connection electrode 190 disposed in the contact region H.

The bridge hole BC exposes the first and second source electrodes 143a and 143b spaced apart from each other. The bridge electrode 193 connects the first and second source electrodes 143a and 143b. In this case, the bridge electrode 193 fills the bridge hole BC to be in contact with the exposed first and second source electrodes 143a and 143b. The second source electrode 143b is connected to the first source electrode 143a using the bridge electrode 193 formed in the bridge hole BC. The first source electrode 143a is connected to the data line 147. Accordingly, the first and second source electrodes 143a and 143b are electrically connected to the data line 147 using the bridge electrode 193. Here, the bridge hole BC passes through the second insulating film 150 and the third insulating film 180. Although not illustrated, the bridge hole BC may also be disposed to selectively overlap the semiconductor layer 130.

And, the contact hole CH exposes the drain electrode 145. The pixel electrode 195 fills the contact hole CH to be in contact with the drain electrode 145. The pixel electrode BC disposed in the contact hole 195 may be formed of a transparent conductive oxide film (TCO) including ITO (indium tin oxide), IZO (indium zinc oxide) or the like.

The bridge electrode 193 disposed in the bridge hole BC and the connection electrode 190 disposed in the contact region H may be formed of a transparent conductive oxide film (TCO) including ITO (indium tin oxide), IZO (indium zinc oxide) or the like, or a metallic conductor such as aluminum. For example, the bridge electrode 193, the connection electrode 190 and the pixel electrode 195 may be formed of the same material including ITO and IZO. In this case, a manufacturing process of the transistor TR may be simplified. Such simplified manufacturing process will described later. Alternatively, the pixel electrode 195 may be formed of a different material from that of the bridge electrode 193 and the connection electrode 190.

Referring to FIG. 3, by forming the second gate electrode 170 on the second insulating film 150 to form a dual gate transistor, the first channel region A is formed at an interface between the first insulating film 120 and the semiconductor layer 130, and a second channel region B is formed at an interface between the semiconductor layer 130 and the second insulating film 150. Thus, the two channel regions in are formed in parallel between the source electrode 143 and the drain electrode 145.

Thus, the thin film transistor TR may have current amount about two times compared with a single channel transistor occupying the same area and having the same gate width of the thin film transistor TR. Therefore, using a dual gate according to the present invention may increase the degree of integration without decreasing the drive capability of a transistor having the dual gate.

Therefore, the threshold voltage of the thin film transistor TR is controlled by the second gate electrode 170 such that the film transistor TR is in a normally-off state; the on-current of the thin film transistor TR increases; the off-current of the transistor TR is decreased; or the on-off ratio of the transistor TR is increased.

In addition, a display device including a thin film transistor according to an exemplary embodiment of the present invention may display a clear screen. The organic film 160 having a flattened surface may improve the aperture ratio.

Figure 4:
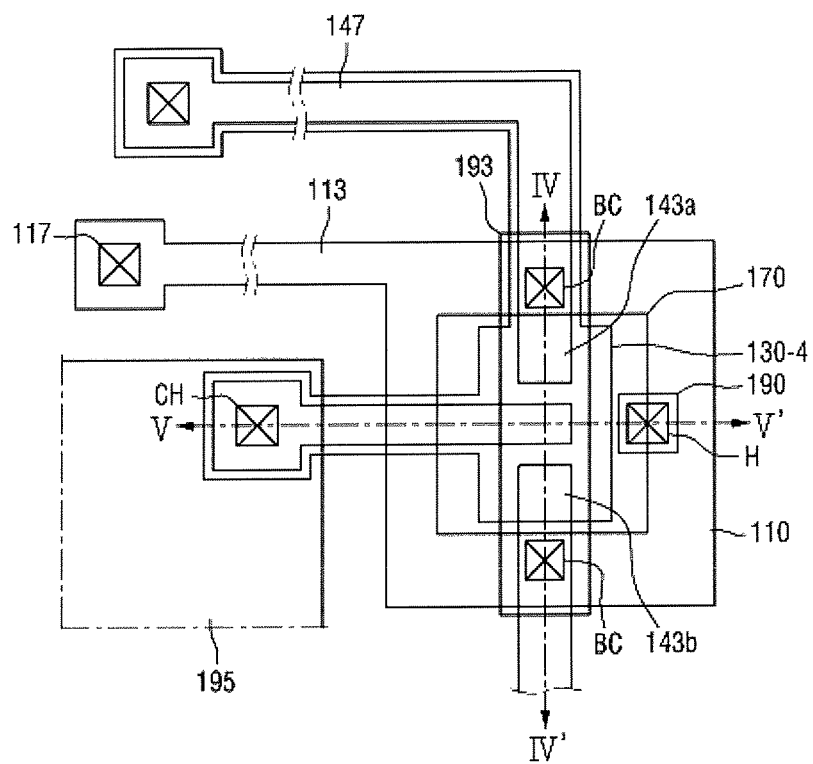
FIG. 4 is a layout of a thin film transistor according to an exemplary embodiment of the present invention.
Figure 5:
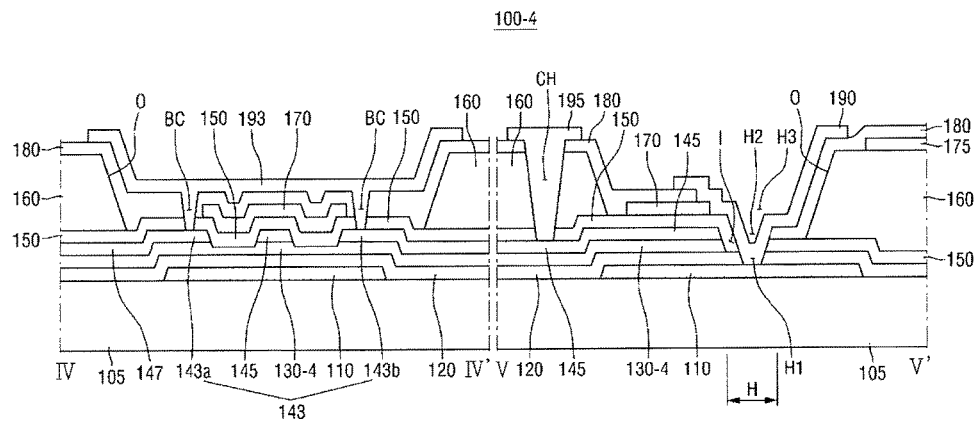
FIG. 5 is a cross-sectional view taken along line IV-IV' and line V-V' of FIG. 4.

FIG. 4 is a layout of a thin film transistor according to an exemplary embodiment of the present invention, and FIG. 5 is a cross-sectional view taken along line IV-IV' and line V-V' of FIG. 4.

Here, FIGS. 4 and 5 will be described with reference to FIGS. 1 to 3, and the repeated elements will be briefly described or omitted.

Referring to FIGS. 4 and 5, a thin film transistor 100-4 is different from the thin film transistor of FIGS. 1 and 2 in that a semiconductor layer 130-4, a source electrode 143, a drain electrode 145 and a data line 147 are patterned at the same time using the same process. For example, the semiconductor layer 130-4 is disposed under the source electrode 143, the drain electrode 145 and the data line 147, and the semiconductor layer 130-4 does not extend beyond a patterned side of the drain electrode 145.

Thus, the semiconductor layer 130-4 does not have a part interposed between the first and second insulating films 120 and 150.

Here, in the forming the of semiconductor layer 130 and the drain electrode 145, a part of the first insulating film 120 is exposed to form the second gate insulating region I.

The second insulating film 150 is disposed on the substrate 105 in which the source electrode 143 and the drain electrode 145 are disposed. The organic film 160 having an opening O is disposed on the second insulating film 150. For example, the first gate electrode 110 is formed below the opening O. The second gate electrode 170 is disposed on the first gate electrode 110 and disposed in the opening O. The third insulating film 180 is disposed on the opening O of the organic film 160.

The organic film 160 may be formed of an organic material having planarization characteristics and photosensitivity, or a low dielectric constant insulating material including a-Si:C:O, or a-Si:O:F formed by a plasma enhanced chemical vapor deposition (PECVD) process. Alternatively, the organic film 160 may be formed of a color filter.

Thus, in order to protect the portion of the exposed semiconductor layer 130 while taking advantage of the planarization characteristics of the organic film 160 via the formation of the organic film 160 on the second insulating film 150, a double film structure of the second insulating film 150 as an inorganic film and an upper organic film of the second insulating film 150 is formed. Thus, the second insulating film 150 as an inorganic film may be disposed in the second gate insulating region I.

The second gate electrode 170 is disposed on the first gate electrode 110, overlapping the first gate electrode 110. The second gate electrode 170 overlaps a part of the semiconductor layer 130 and a part of the source electrode 143 and the drain electrode 145.

Here, a third hole H3 is formed in the third insulating and is concentric with the first hole H1 and the second hole H2.

In a contact region H, the first hole H1 is formed in the first insulating film 120, the second hole H2 is formed in the second insulating film 150 and the third hole H3 is formed in the third insulating film 180. A part of the first gate electrode 110 is exposed in the contact region H through the holes H1 to H3.

The third hole H3 is greater than the second hole H2 to partially expose the second gate electrode 170 disposed on the second insulating film 150. Then, the connection electrode 190 is disposed on the contact region H so that the second gate electrode 170 and the first gate electrode 110 is electrically connected to each other through the connection electrode 190 disposed in the contact region H.

In an exemplary embodiment, a thin film transistor 100-4 is formed of a double gate structure which has the first gate electrode 110 and the second gate electrode 170 that are electrically connected to each other.

Since the channels are formed at the bottom and top of the semiconductor layer 130-4 by voltage applied to the two gate electrodes 110 and 170 formed at each of the bottom and top of the semiconductor layer 130-4 in the above-mentioned thin film transistor TR, the on-current characteristics are improved, and it is possible to adjust the threshold voltage to a desired level depending on the magnitude of the voltage.

FIGS. 6 to 15 are cross-sectional views illustrating a method of manufacturing a thin film transistor according to an exemplary embodiment of the present invention. The description will be made with reference to FIGS. 1 to 3, and the repeated elements will be briefly described or omitted.

In each drawing of FIGS. 6 to 16, the left drawing is a cross-sectional view taken along line I-I' of FIG. 1, and the right drawing is a cross-sectional view taken along line II-II' of FIG. 1. Specifically, the left drawing shows a region where a bridge electrode is formed, and the right drawing shows a region where a first gate electrode is in contact with a second gate electrode.

Figure 6:
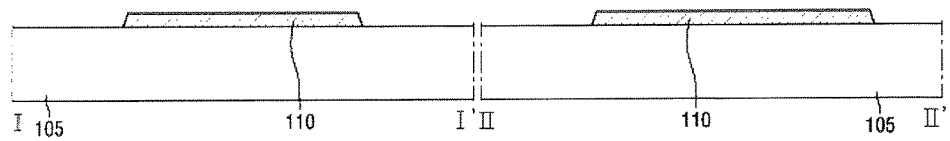
FIGS. 6 to 15 are cross-sectional views illustrating a method of manufacturing the thin film transistor of FIG. 1 according to an exemplary embodiment of the present invention.

As illustrated in FIG. 6, a first gate electrode 110 branching from the gate line 113 is formed on a substrate 105. The first gate electrode 110 may be formed of at least one of an aluminum-based metal such as aluminum (Al) and aluminum alloy, a silver-based metal such as silver (Ag) and silver alloy, a copper-based metal such as copper (Cu) and copper alloy, a molybdenum-based metal such as molybdenum (Mo) and molybdenum alloy, chromium (Cr), titanium (Ti), and tantalum (Ta). The conductive material for the first gate electrode 110 is not limited thereto.

Further, the first gate electrode 110 may have a multi-layered structure which includes two conductive films (not illustrated) having different physical properties. First conductive film of these two conductive films may be formed of a metal of low resistivity including, for example, an aluminum (Al)-based metal, a silver (Ag)-based metal or a copper (Cu)-based metal to reduce the signal delay or the voltage drop of the first gate electrode 110.

Second conductive film may be formed of a conductive material including a molybdenum (Mo)-based metal, chromium (Cr), titanium (Ti), or tantalum (Ta). The conductive material may have adhesive properties with respect to an indium tin oxide (ITO) film or an indium zinc oxide (IZO) film. For example, the second conductive film is a Cr film, and the first conductive film is an aluminum film. Alternatively, the second conductive film is an aluminum film, and the first conductive film is a molybdenum film. However, the present invention is not limited thereto, and the first gate electrode 110 may be formed at least two or more conductive layers.

To form the first gate electrode 110, a metallic material is formed on the substrate 105 and then, the metallic material is patterned using a photolithography process using a photomask and an etching process.

Figure 7:
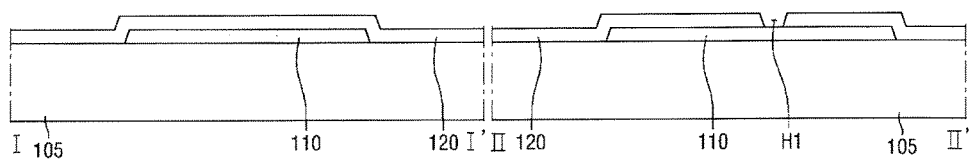

As illustrated in FIG. 7, a first insulating film 120 formed of silicon oxide or silicon nitride is formed on the whole surface of the substrate 105 including the first gate electrode 110, and a first hole is formed in the first insulating film 120 on a first gate electrode 110.

Here, a pad region 117 of the gate line 113 may be formed in a process of opening the gate pad region 117. The pad region 117 may serve to receive a gate signal and transmit the gate signal to the gate electrodes 110 and 170 of FIG. 1. When the gate pad region is formed, the contact region H of the first gate electrode 110 may be formed by partially etching the first insulating film 120. The first hole H1 exposes a part of the first gate electrode 110.

Figure 8:
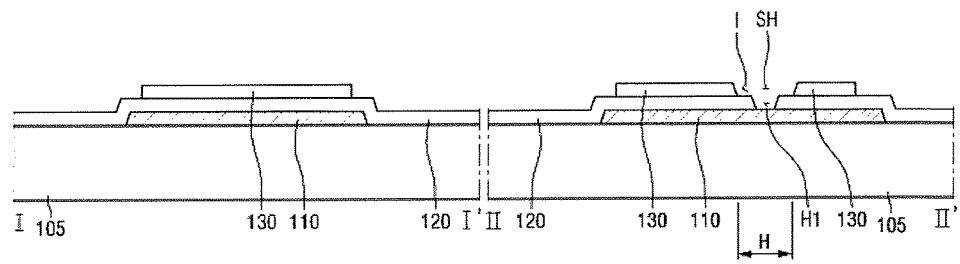

As illustrated in FIG. 8, a preliminary semiconductor layer made of hydrogenated amorphous silicon or polycrystalline silicon is formed on the resulting structure of FIG. 7, and then a photolithography process may be performed on the preliminary semiconductor layer to form a semiconductor layer 130.

As the semiconductor layer 130 may include a semiconductor material layer made of the amorphous silicon or the like. Alternatively, the semiconductor layer 130 may be formed of an oxide-based oxide semiconductor including zinc oxide (ZnO) or the like.

Here, the semiconductor layer 130 may have various shapes, such as, an island pattern and a linear pattern, and may be disposed on the first gate electrode 110 in an island pattern shape as illustrated. The above-described semiconductor layer 130 may be disposed in a region which includes first and second source electrodes 143a, 143b and the drain electrode 145 to be formed later.

A semiconductor hole SH of the semiconductor layer 130 may define the contact region H.

Here, the semiconductor layer hole SH passing through the semiconductor layer 130 is connected to the first hole H1. The semiconductor layer hole SH is greater than the first hole H1. The semiconductor layer hole SH and the first hole H1 may be concentric to one another.

Therefore, a part of the first insulating film 120 is exposed through the semiconductor layer hole SH. In this case, The semiconductor layer hole SH may define a second gate insulating region I in which the upper surface of the first insulating film 120 is exposed by the partial removal of the semiconductor layer 130.

Meanwhile, although not illustrated in the drawings, an ohmic contact layer made of a material such as n+ hydrogenated amorphous silicon silicide doped with n-type impurity at a high concentration may be disposed on the semiconductor layer 130.

Moreover, while forming the semiconductor layer hole SH, the pattern of the semiconductor layer 130 partially floating to the section according to the shape of the pattern of the semiconductor layer 130 may remain in the semiconductor layer 130. In an exemplary embodiment, the floating pattern need not exist depending on the designed shape of the semiconductor layer 130, and the floating semiconductor layer pattern is illustrated in the state of being left in the drawings.

Thus, the semiconductor layer hole SH exposes a part of the first gate electrode 110. The semiconductor layer hole SH may be concentric with the first hole H1 in the forming of the pattern of the semiconductor layer 130.

When the bridge hole BC to be formed later is disposed to overlap the semiconductor layer 130, the semiconductor material layer disposed on the bridge hole BC is etched in the forming of the semiconductor layer hole SH.

Here, the semiconductor layer hole SH is greater than the first hole H1. This is in order to dispose the insulating layers formed on the second gate insulating region I formed between the first insulating film 120 and the semiconductor layer 130 later.

Specifically, by forming the semiconductor layer hole SH greater than the first hole H1 to expose a part of the first insulating film 120 adjacent to the first hole H1, the semiconductor layer 130 can be disposed so as to be spaced apart from the contact region H. Therefore, the insulation layers can be disposed on the second gate insulating region later. Therefore, the insulating layers disposed on the second gate insulating region I can play the role of forming a channel in the semiconductor layer 130 later, similarly to the first insulating film 120.

Figure 9:
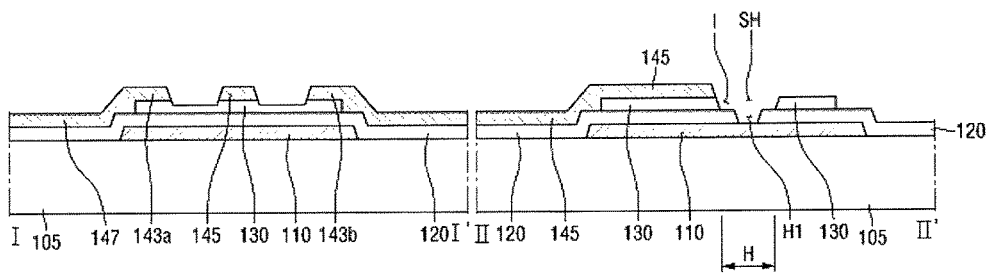

As illustrated in FIG. 9, a drain electrode 145 is formed on the semiconductor layer 130 and the first insulating film 120. Moreover, a data line 147, a first source electrode 143a branching from the data line 147, and a second source electrode 143b spaced apart from the first source electrode 143a at a predetermined interval can be formed so as to be disposed on the substrate 105 are formed on the semiconductor layer 130 and the first insulating film 120. The drain electrode 145 is disposed between the first source electrode 143a and the second source electrode 143b.

To form the data line 147, the source electrode 143 branching from the data line 147, and the drain electrode 145 spaced apart from the source electrode 143 at a predetermined interval, a metal layer may be first deposited, and then the metal layer may be patterned using a mask pattern or the like using an etching process. Here, a part of the source electrode 143 and the drain electrode 145 may be formed on the ohmic contact layer.

The data line 147, the source electrode 143 and the drain electrode 145 may be formed of a refractory metal including chromium, molybdenum-based metal, tantalum or titanium. The data line 147, the source electrode 143 and the drain electrode 145 may be multilayered, including a refractory metal layer and a low resistance material layer. For example, the data line 147, the source electrode 143 and the drain electrode 145 may be formed of two film layers of a chromium and aluminum film or an aluminum and molybdenum film or three film layers of a molybdenum film—an aluminum film—a molybdenum film.

The metal layer is, using an etching process, patterned to form the source electrode 143 and the drain electrode 145. In the etching process, a partial surface of the first gate electrode 110 is exposed by the first hole H1 and the semiconductor layer hole SH, and thus the etching process has etching selectivity of the metal layer with respect to the first gate electrode.

Figure 10:
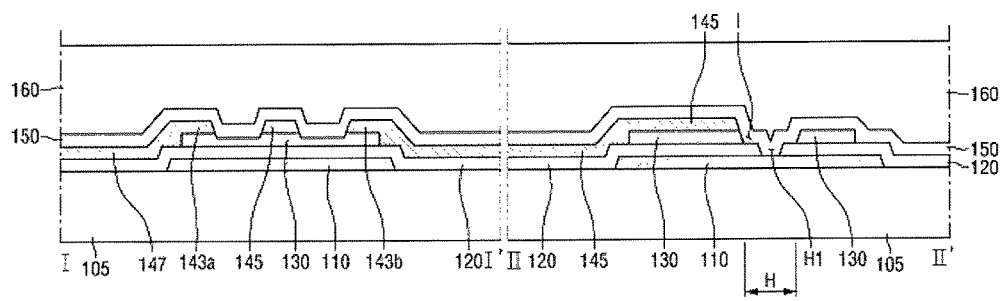

As illustrated in FIG. 10, the second insulating film 150 is formed on the resulting structure of FIG. 9.

The second insulating film 150 may be formed of an inorganic material including silicon nitride (SiNx) or silicon oxide (SiOx). The second insulating film 150 is also disposed on the second gate insulating region I.

For example, the second insulating film 150 is in contact with the exposed, upper surface of the first insulating film 120, and the side surface of the semiconductor layer 130. The second insulating film 150 is also formed on the semiconductor layer 130 exposed by the source electrode 143 and/or the drain electrode 145. Thus, the exposed semiconductor layer 130 may be protected by the second insulating film 150 having an inorganic material.

Moreover, the organic film 160 may be formed of an organic material having planarization characteristics, photosensitivity and/or a low dielectric constant insulating material, such as a-Si:C:O, a-Si:O:F formed by plasma enhanced chemical vapor deposition (PECVD). Otherwise, the organic film 160 may be formed of a color filter.

Figure 11:
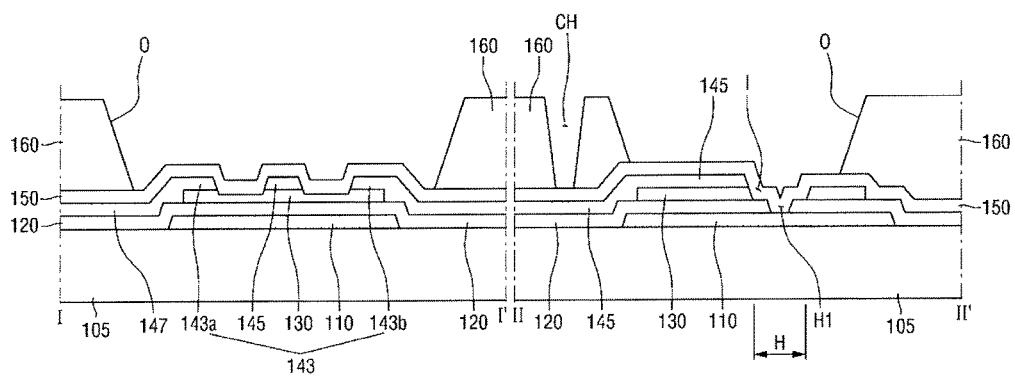

As illustrated in FIG. 11, the organic film 160 is etched such that a contact hole CH is formed on the drain electrode 145 and an opening is formed on the first gate electrode 110. Here, the contact hole CH expose a part of the second insulating film 150. The drain electrode 145 is protected by the second insulating film 150 in the formation of the contact hole CH and the opening O.

In an exemplary process, forming of the opening O is formed with the contact hole CH without using an additional mask process.

In an exemplary embodiment, the organic film 160 may be formed of two film layers having a lower inorganic film and an upper organic film to protect the exposed part of the semiconductor layer 130 and have the planarization characteristics of the upper organic film. Thus, the aperture ratio of a display device including the thin film transistor according to the present embodiment may increase.

Figure 12:
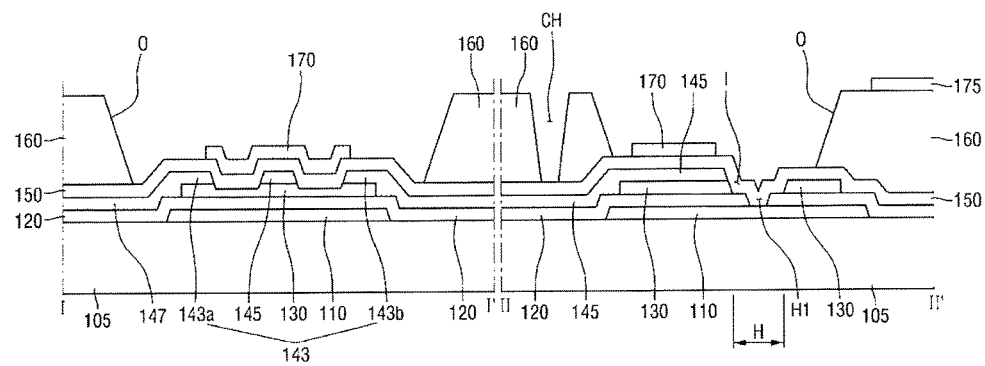

As illustrated in FIG. 12, the second gate electrode 170 is formed on the second insulating film 150 exposed by the opening O of the organic film 160, and the common electrode 175 is formed on an upper surface of the organic film 160.

The second gate electrode 170 is formed on the second insulating film 150 in the opening O. The common electrode 175 is formed on the upper surface of the organic film 160.

The second gate electrode 170 is spaced apart from the common electrode 175, while forming the common electrode 175.

The second gate electrode 170 may have various shapes in consideration of the shape of the semiconductor layer 110. The second gate electrode 170 covers a part of the first gate electrode 110. The second gate electrode 170 is formed on the semiconductor layer 130, overlap a part of the source electrode 143 and the whole of the drain electrode 145.

The common electrode 175 is formed on an upper surface of the organic film 160, and the common electrode 175 is not be formed in the opening O where the thin film transistor TR are formed.

The common electrode 175 and the second gate electrode 170 may be formed using the same material including ITO or IZO. For example, the common electrode 175 and the second gate electrode 170 may be formed in the same process including a deposition process of a metal layer, a photomask process and an etching process of patterning the metal layer to form the common electrode 175 and the second gate electrode 170.

The second gate electrode 170 may be formed of the same metal as the material for forming the common electrode 175. Alternatively, the second gate electrode 170 may be formed of the different metals from the common electrode 175. When forming them by the same material, without adding the mask, the second gate electrode 170 may be formed by suing a single mask. Accordingly, the process of forming the second gate electrode 170 and the common electrode 175 may be simplified as compared with when the second gate electrode 170 and the common electrode 170 may be formed using different process steps.

The metal for forming the common electrode 175 and the second gate electrode 170 may be formed of a conductive metal including a transparent conductive oxide, or aluminum. However, the present invention is not limited thereto.

Figure 13:
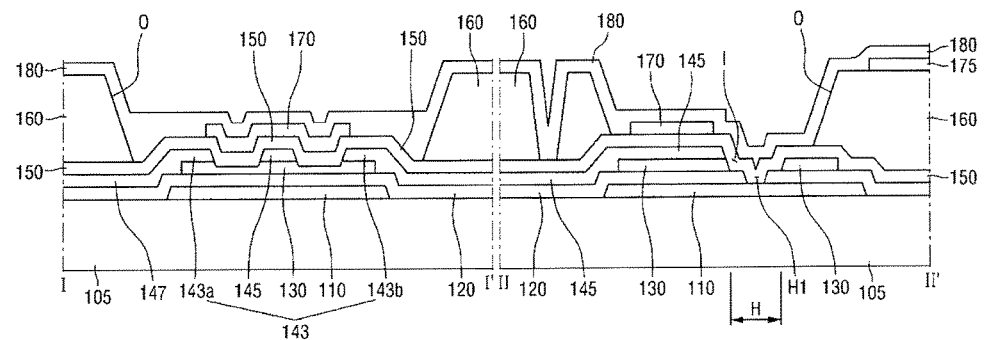

As illustrated in FIG. 13, a third insulating film 180 is formed on the resulting structure of FIG. 12, without completely filling the opening O and the contact hole CH.

The third insulating film 180 may be formed of the same material as that of the second insulating film 150.

For example, the second and third insulating films 150, 180 are formed on the drain electrode 145. The second and third insulating films 150, 180 are also formed on the first and second source electrodes 143a and 143b. Moreover, the second and third insulating film layers 150, 180 are also formed on the contact region H.

Figure 14:
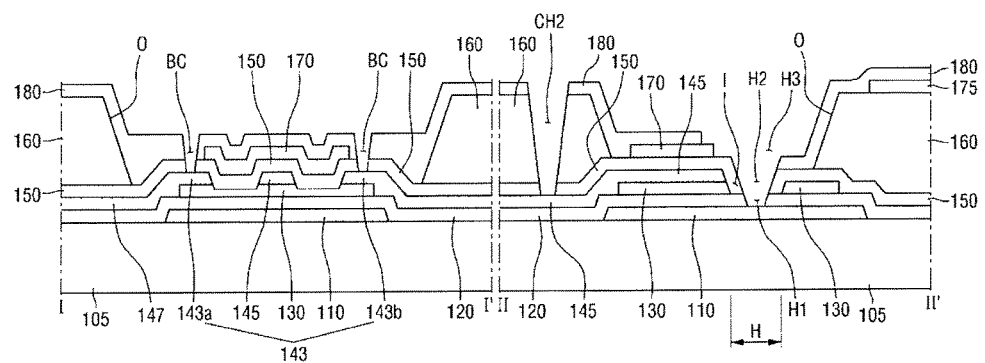

As illustrated in FIG. 14, three contact holes BC, CH2 and H2 are formed in the second and third insulating film layers 150 and 180. A first contact hole BC may be referred to as a bridge hole.

The second contact hole CH2 is formed in a region in which the drain electrode 145 of FIG. 1 is to be positioned. Here, the contact hole CH2 may be formed by partially etching the second insulating film 150 and the third insulating film 180. The pixel electrode 195 of FIG. 1 is disposed on the contact hole CH later.

The bridge hole BC is formed to expose the first and second source electrodes 143a and 143b. For example, the second insulating film 150 and the third insulating film 180 are partially etched to expose the first and second source electrodes 143a and 143b. The bridge hole BC is formed on each of the second source electrode 143b and the first source electrode 143a which is spaced apart from each other. The second source electrode 143b, shown in FIG. 1, is connected to the data line 147. The bridge electrode 193 is disposed on the bridge hole BC later so as to be able to connect the second source electrode 143b and the first source electrode 143a connected to the data line 147.

The contact region H is formed at the position corresponding to the first hole H1 and the semiconductor layer hole SH which have been previously formed. The second insulating film 150 and the third insulating film 180 are laminated in the region in which the first hole H1 and the semiconductor layer hole SH have been formed.

Here, the first hole H1 is formed by etching the first insulating film 120 and the second hole H2 by etching the second insulating film 150 on the first hole H1, and it is possible to form the third hole H3 by etching the third insulating film 180 at a position corresponding to the second hole H2. Thus, the second insulating film 150 as an inorganic film is disposed in the second gate insulating region I.

Thus, the second insulating film 150 may insulate the semiconductor layer 130 and the connection electrode 190 formed later from each other and can insulate the second gate electrode 170, the source electrode 143 and the drain electrode 145 from one another.

In the contact region H, the first hole H1 is formed by removing the first insulating film 120, the second hole H2 is formed by removing the second insulating film 150 and the third hole H3 is formed by removing the third insulating film 180. The first, second and third holes H1, H2, H3 are connected to each other, to expose a part of the first gate electrode 110 in the contact region H. For example, the top of the first gate electrode 110 is exposed in the contact region H.

The third hole H3 is greater than the second hole H2 to expose the second gate electrode 175. The third hole H3 is formed by etching the third insulating film 180, and the second hole H2 is formed by etching the second insulating film 150.

Therefore, the contact region H, the bridge hole BC and the contact hole CH, are formed simultaneously without any additional mask.

Figure 15:
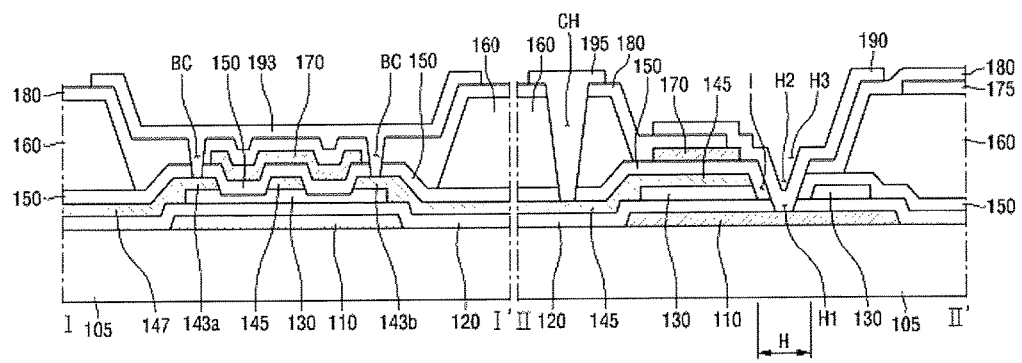

As illustrated in FIG. 15, a pixel electrode 195, a connection electrode 190 and a bridge electrode 193 are formed through the first to third contact holes BC, CH2 and H2, respectively.

The pixel electrode 195, the connection electrode 190 and the bridge electrode 193 may be formed of the same material, or may be formed of the different materials from one another.

If the pixel electrode 195, the connection electrode 190 and the bridge electrode 193 are formed of the different materials from one another, the connection electrode 190 and the bridge electrode 193 disposed in a non-display region may be formed of a non-transparent conductive metal such as aluminum. The pixel electrode 195 may be formed of a transparent conductive oxide film including ITO or IZO.

If the pixel electrode 195, the connection electrode 190 and the bridge electrode 193 are formed of the same material, a transparent conductive oxide film (TCO) including ITO or IZO may be used as the pixel electrode 195, the connection electrode 190 and the bridge electrode 193 together using a single mask pattern. Thus, the number of processes may be reduced.

Thus, a dual gate structure including the first and second gate electrodes 110 and 170 which are connected through the connection electrode 190 to each other is formed without using at least one additional mask processes by forming connection electrode 190 and the pixel electrode 195 in the same process, and by forming the second gate electrode 170 and the common electrode 175 in the same process.

In response to the on/off signal of the gate electrode 110 of the thin film transistor TR, a first channel region A, shown in FIG. 3, is formed in the semiconductor layer 130. The gate signal input from the first gate electrode 110 is transmitted to the second gate electrode 170, the second insulating film 150 formed on the second gate insulating region I plays the same role as that of the first insulating film 120, and thus, a second channel region B shown in FIG. 3, is formed in the semiconductor layer 130.

In an exemplary embodiment, a transistor having a dual gate structure may be formed without using additional mask processes.

Thus, without increasing a width of a transistor (or without increasing an area of a transistor), current amount may increase at least two times using a dual gate structure according to an exemplary embodiment. Therefore, the degree of integration increases while the drive capability of the gate drive circuit is secured. Also, since the connection electrode 190 which connects the second gate electrode 170 and the first gate electrode 110 is formed when forming the pixel electrode 195 and the common electrode 175 according to an exemplary embodiment, an additional process is not necessary to form the connection electrode 190.

The threshold voltage of the thin film transistor TR is controlled by the second gate electrode 170 such that the film transistor TR is in a normally-off state; the on-current of the thin film transistor TR increases; the off-current of the transistor TR is decreased; or the on-off ratio of the transistor TR is increased.

FIGS. 16 to 23 are cross-sectional views illustrating a method of manufacturing a thin film transistor according to an exemplary embodiment of the present invention. Here, the thin film transistor is referred to the transistor of FIGS. 4 and 5. For the convenience of description, the same elements will be omitted or be briefly described by referring to FIGS. 6 to 15.

Figure 16:
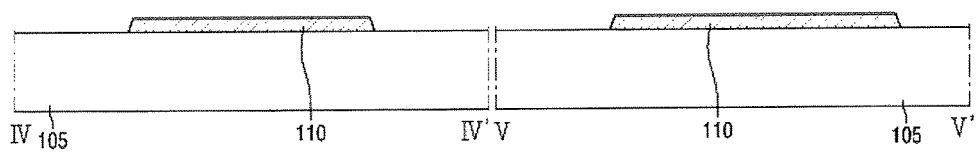
FIGS. 16 to 23 are cross-sectional views illustrating a method of manufacturing the thin film transistor of FIG. 4 according to an exemplary embodiment of the present invention.

As illustrated in FIG. 16, a first gate electrode 110 is formed on the substrate 105.

Figure 17:
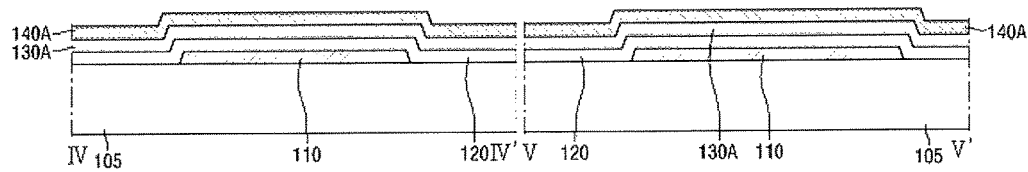

As illustrated in FIG. 17, it is possible to form the first insulating film 120 on the whole surface of the substrate 105 on which the first gate electrode 110 is formed. Subsequently, a semiconductor material layer 130A and a conductive metal layer 140A are deposited on the whole surface of the first insulating film 120.

Figure 18:
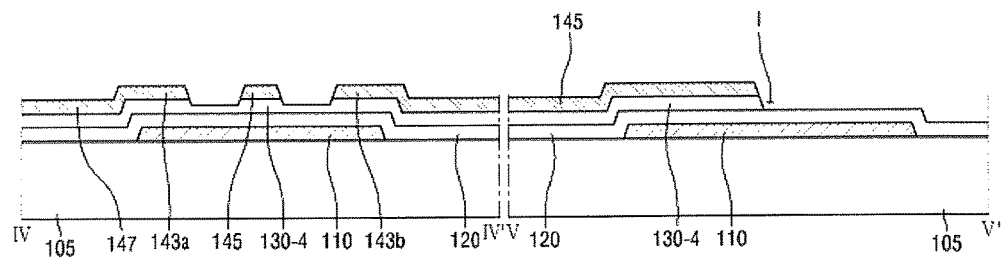

As illustrated in FIG. 18, by simultaneously patterning the semiconductor material layer 130A and the conductive metal layer 140A, it is possible to simultaneously form the semiconductor layer 130, the data line 147, the first source electrode 143a connected to the data line 147, the second source electrode 143b spaced apart from the first source electrode 143a at a predetermined interval, and the drain electrode 145.

The thin film transistor 100-4 of FIG. 4 may be formed by simultaneously patterning the semiconductor material layer 130A and the conductive metal layer 140A to form the semiconductor layer 130-4, the source electrode 143, the drain electrode 145 and the data line 147.

The semiconductor layer 130-4, the source electrode 143 and the drain electrode 145 are formed on the first insulating film 120 in the same pattern. Here, no contact hole is formed in the semiconductor layer 130-4 unlike the semiconductor layer 130 having the contact hole H1.

Further, in forming the semiconductor layer 130-4, the source electrode 143 and the drain electrode 145, a part of the first insulating film 120 is exposed so that a second gate insulating region I is formed.

Figure 19:
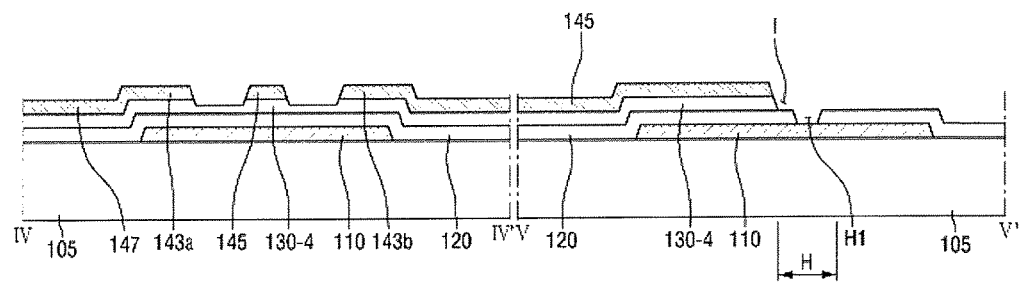

As illustrated in FIG. 19, the upper portion of the first gate electrode 110 is exposed, by forming a first hole H1 to correspond to the contact region H of the first insulating film 120. For example, the first hole H1 is formed in a region spaced from the semiconductor layer 130 at a predetermined interval in the formation region of the second gate insulating region I. As described above, when opening the gate pad, since the first hole H1 can be simultaneously etched by the same mask, the first hole H1 can be formed even without additional mask process.

Alternatively, the first hole H1 may be formed before the formation of the second gate insulating region I. The first hole H1 may serve as an align key in a photolithography process to form the second gate insulating region I. Accordingly, the formation of the contact region H may be formed using the first hole H1 as an align key.

Alternatively, the first hole H1 may be formed by partially etching the first insulating layer 120, a second insulating film 150 and a third insulating film 180. In this case, the first hole H1 may be formed after the first insulating layer 120, the second insulating film 150 and the third insulating film 180 are sequentially deposited.

Figure 20:
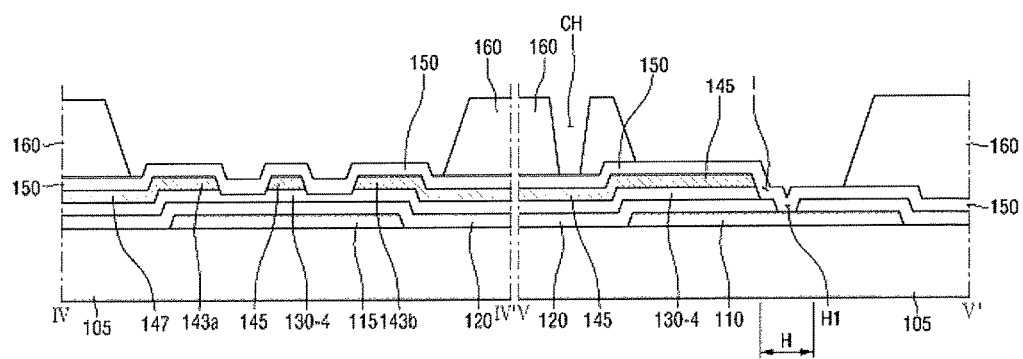

As illustrated in FIG. 20, the second insulating film 150 is formed on the resulting structure of FIG. 19. The organic film 160 is formed on the second insulating film 150.

Here, the organic film 160 may be etched to form an opening O and a contact hole CH. A pixel electrode 195 is disposed in the contact hole CH. Thus, the organic film 160 is etched to expose the second insulating film 150.

Figure 21:
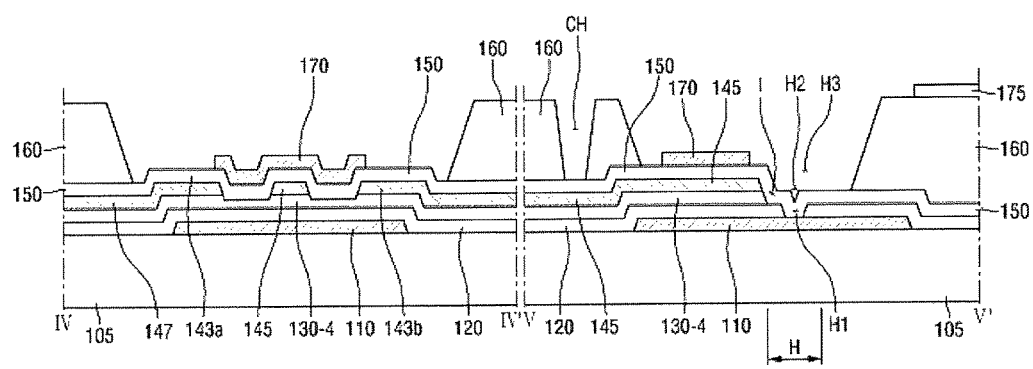

As illustrated in FIG. 21, the second gate electrode 170 is formed on the exposed region of the second insulating film 150. The second gate electrode 170 overlaps a part of the first gate electrode 110. The second gate electrode 170 is disposed on the semiconductor layer 130, overlapping a part of the source electrode 143. The drain electrode 145 is formed underneath of the second gate electrode 170.

Here, the second gate electrode 170 is formed on the second insulating film 150, and the common electrode 175 is formed on the organic film 160.

The second gate electrode 170 and the common electrode 175 may be formed of the same material or in the same process. If they are formed of the same material, the second gate electrode 170 and the common electrode 175 may be formed simultaneously in the same process using a single mask process.

Figure 22:
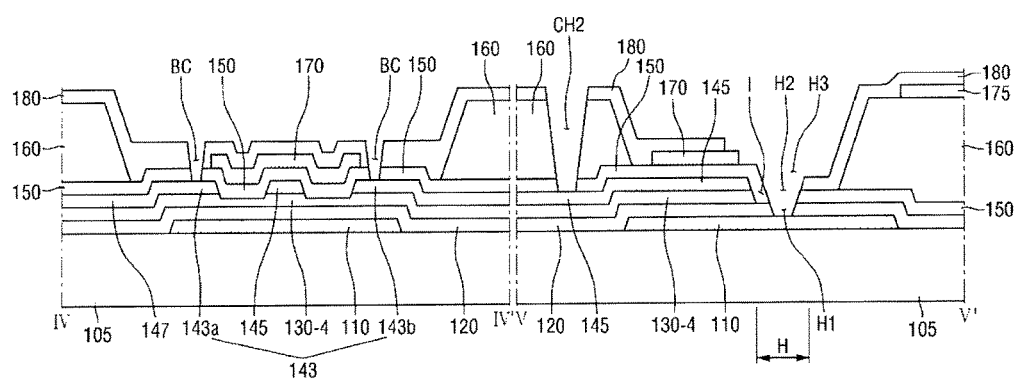

As illustrated in FIG. 22, a third insulating film 180 is formed on the resulting structure of FIG. 21. Three contact holes BC, CH2 and H2 are formed. A first contact hole BC may be referred to as a bridge hole BC. For example, the contact holes BC and CH2 are formed by etching the second and third insulating films 150 and 180 in the same process. A third contact hole H2 is formed by etching the second insulating film 150 that fills the first hole H1 to the extent that the first gate electrode 110 is exposed.

The contact hole CH2 is formed to expose the drain electrode 145. For example, the contact hole CH2 is formed by etching the second insulating film 150 and the third insulating film 180. A pixel electrode 195 may be disposed in the contact hole CH later.

The bridge hole BC is formed to expose the source electrode 143. For example, the bridge hole BC is formed by etching the second insulating film 150 and the third insulating film 180 to expose the source electrode 143. For example, the bridge hole BC is formed by removing the same layer as the contact hole CH. The bridge hole BC is formed in each of the source electrode 143a and the source electrode 143b which is spaced apart from the source electrode 143a. The source electrode 143a, shown in FIG. 4, is connected to the data line 147. The bridge electrode 193 is disposed in the bridge hole BC to connect the second source electrode 143b and the data line 147 to each other.

Moreover, the contact region H is formed by etching the second insulating film 150 which fills the first hole H1 which was previously formed.

In the contact region H, the third hole H3 is greater than the second hole H2. The third hole H3 is formed by etching the third insulating film 180, and the second hole H2 is formed by etching the second insulating film 150.

The third hole H3 is connected to the first and second holes H1, H2 and exposing a part of the first gate electrode 110. For example, the third hole H3 exposes the top of the first gate electrode 110 located in the contact region H.

In this way, the holes may be formed by removing the same layers as the contact region H, the bridge hole BC and the contact hole CH, and they may be formed simultaneously without any additional mask.

Figure 23:
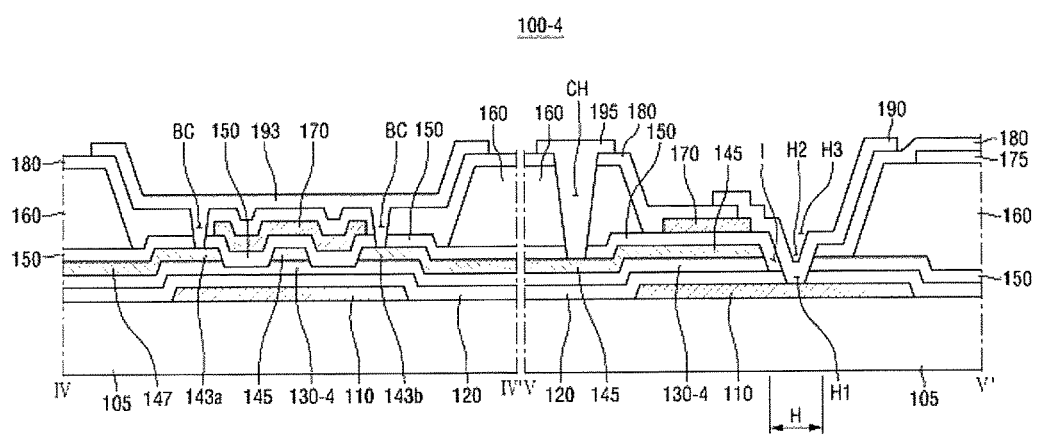

As illustrated in FIG. 23, a pixel electrode 195, a connection electrode 190, and a bridge electrode 193 may be formed in the three contact holes BC, CH2 and H. The contact region may be referred to as a contact hole including the holes H1 to H3.

The bridge electrode 193 is formed in the bridge hole BC, the pixel electrode 195 is formed in the contact hole CH, and the connection electrode 190 is formed in the contact region H.

The pixel electrode 195, the connection electrode 190 and the bridge electrode 193 may be formed of the same material or in the same process. Alternatively, the pixel electrode 195, the connection electrode 190 and the bridge electrode 193 may be formed of the different materials from one another. For example, a transparent conductive oxide film (TCO) such as ITO or IZO may be used as the pixel electrode 195, and a conductive metal such as aluminum may be used as the connection electrode 190 and the bridge electrode 193 disposed in the non-display region.

If a transparent conductive oxide film (TCO) such as ITO or IZO used for the pixel electrode 195 is used as the connection electrode 190 and the bridge electrode 193, the pixel electrode 195, the connection electrode 190 and the bridge electrode 193 may be formed in a single mask pattern. In this case, the number of processes may be reduced.

By forming the connection electrode 190 and the pixel electrode 195 in the same process, and by forming the second gate electrode 170 and the common electrode 175 in the same process, a transistor having a dual gate structure may be formed without using an additional mask process.

Referring back to FIG. 3, in response to the on/off signal of the first gate electrode 110 of the thin film transistor TR, a first channel region is formed in the semiconductor layer 130. The gate signal input from the first gate electrode 110 is transmitted to the second gate electrode 170, the second insulating film 150 formed on the second gate insulating region I plays the same role as that of the first insulating film 120, and the second channel region B is formed in the semiconductor layer 130.

Therefore, a thin film transistor having dual gates is formed, without using additional mask processes, according to an exemplary embodiment.

Thus, the thin film transistor TR may have current amount about two times compared with a single channel transistor occupying the same area and having the same gate width of the thin film transistor TR. Therefore, using a dual gate according to the present invention may increase the degree of integration without decreasing the drive capability of a transistor having the dual gate.

Therefore, the threshold voltage of the thin film transistor TR is controlled by the second gate electrode 170 such that the film transistor TR is in a normally-off state; the on-current of the thin film transistor TR increases; the off-current of the transistor TR is decreased; or the on-off ratio of the transistor TR is increased.

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A thin film transistor comprising:
    a first gate electrode and a second gate electrode stacked on each other;
    a semiconductor layer interposed between the first and second gate electrodes;
    a source electrode and a drain electrode interposed between the semiconductor layer and the second gate electrode;
    a connection electrode connecting electrically the first gate electrode and the second gate electrode;
    a first insulating film interposed between the first gate electrode and the semiconductor layer;
    a second insulating film including a first part interposed between the semiconductor layer and the second gate electrode and a second part interposed between the second gate electrode and the drain electrode; and
    a third insulating film including a first part interposed between the connection electrode and the second gate electrode.

2. The thin film transistor of claim 1, further comprising:
    an organic film interposed between the second insulating film and the third insulating film, wherein the stacked first and second gate electrodes are positioned in an opening of the organic film.

3. The thin film transistor of claim 2, further comprising:
    a common electrode disposed on an upper surface of the organic film, wherein
    the common electrode and the second gate electrode are formed of substantially the same material.

4. The thin film transistor of claim 1, wherein the source electrode includes a first source electrode and a second source electrode, wherein the drain electrode is disposed between the first source electrode and the second source electrode, and wherein the first part of the second insulating film is disposed between the first source electrode and the drain electrode.

5. The thin film transistor of claim 4, further comprising:
    a pixel electrode connected to the drain electrode through a first contact hole, wherein the first contact hole penetrates the second and third insulating films to expose the drain electrode, and
    a bridge electrode connecting the first source electrode and the second source electrode through second and third contact holes, respectively, wherein the second and third contact holes penetrate the first and second insulating films to exposed the first and second source electrodes.

6. The thin film transistor of claim 5, wherein the pixel electrode, the connection electrode and the bridge electrode are formed of substantially the same material.

7. The thin film transistor of claim 1, wherein the second insulating film further includes a third part interposed between the connection electrode and a sidewall of a stacked structure of the drain electrode and the semiconductor layer.

8. The thin film transistor of claim 7, wherein the second insulating film insulates electrically the semiconductor layer from the connection electrode.

9. The thin film transistor of claim 1, wherein the second gate electrode includes a part exposed between the second and third insulating films, wherein the exposed part of the second gate electrode is connected electrically to the first gate electrode through the connection electrode.

* * * * *